(12) United States Patent
Hao et al.

(10) Patent No.: US 10,564,493 B2
(45) Date of Patent: Feb. 18, 2020

(54) DISCHARGE CIRCUIT, ARRAY SUBSTRATE, LIQUID CRYSTAL DISPLAY PANEL AND DISPLAY DEVICE

(71) Applicant: BOE TECHNOLOGY GROUP CO., LTD., Beijing (CN)

(72) Inventors: Xueguang Hao, Beijing (CN); Yongda Ma, Beijing (CN); Xinyin Wu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/541,572

(22) PCT Filed: Oct. 21, 2016

(86) PCT No.: PCT/CN2016/102957
§ 371 (c)(1),
(2) Date: Jul. 5, 2017

(87) PCT Pub. No.: WO2017/128780
PCT Pub. Date: Aug. 3, 2017

(65) Prior Publication Data
US 2018/0088420 A1 Mar. 29, 2018

(30) Foreign Application Priority Data
Jan. 29, 2016 (CN) .......................... 2016 1 0065459

(51) Int. Cl.
*G02F 1/1362* (2006.01)
*H01L 27/02* (2006.01)
(Continued)

(52) U.S. Cl.
CPC .... *G02F 1/136204* (2013.01); *H01L 27/0285* (2013.01); *H01L 27/0292* (2013.01);
(Continued)

(58) Field of Classification Search
CPC . G02F 1/136204; G02F 2202/22; G09G 3/36; G09G 2320/0209; G09G 2320/0233;
(Continued)

(56) References Cited

U.S. PATENT DOCUMENTS

2006/0103772 A1* 5/2006 Lee ...................... H01L 27/0248
349/40
2015/0325188 A1* 11/2015 Wei ...................... G09G 3/3648
345/92

FOREIGN PATENT DOCUMENTS

CN 103995407 A 8/2014
CN 203811952 U 9/2014
(Continued)

OTHER PUBLICATIONS

International Search Report dated Jan. 26, 2017.

*Primary Examiner* — Jennifer Mehmood
*Assistant Examiner* — Ngan T Pham Lu
(74) *Attorney, Agent, or Firm* — Dilworth & Barrese, LLP.; Michael J. Musella, Esq.

(57) ABSTRACT

A discharge circuit, an array substrate, a liquid crystal display panel and a display device are provided. The discharge circuit, including a discharge transistor, a signal control end and a low voltage power source end, a gate electrode of the discharge transistor is connected to the signal control end, a first electrode of the discharge transistor is electrically connected to a signal line, and a second electrode of the discharge transistor is electrically connected to the low voltage power source end; the discharge transistor is configured to release charges on the signal line to the low voltage power source end under an action of a control signal output by the signal control end.

18 Claims, 2 Drawing Sheets

(51) Int. Cl.
*H01L 27/12* (2006.01)
*H01L 29/786* (2006.01)
*G09G 3/36* (2006.01)

(52) U.S. Cl.
CPC ........ *H01L 27/0296* (2013.01); *H01L 27/124* (2013.01); *H01L 27/1222* (2013.01); *H01L 29/78663* (2013.01); *H01L 29/78672* (2013.01); *G02F 2202/22* (2013.01); *G09G 3/36* (2013.01); *G09G 2320/0209* (2013.01); *G09G 2320/0233* (2013.01); *G09G 2320/0247* (2013.01)

(58) Field of Classification Search
CPC ........ G09G 2320/0247; H01L 27/0285; H01L 27/0292; H01L 27/0296; H01L 27/1222; H01L 27/124; H01L 29/78663; H01L 29/78672
USPC .......................................................... 345/98
See application file for complete search history.

(56) References Cited

FOREIGN PATENT DOCUMENTS

| | | | |
|---|---|---|---|
| CN | 104297969 A | | 1/2015 |
| CN | 105467707 A | | 4/2016 |
| JP | 08179359 A | | 7/1996 |
| JP | 11233777 A | | 8/1999 |
| JP | 11233778 A | | 8/1999 |
| JP | H11233778 | * | 8/1999 |
| TW | 557398 B | | 10/2003 |

* cited by examiner

DISCHARGE CIRCUIT, ARRAY SUBSTRATE, LIQUID CRYSTAL DISPLAY PANEL AND DISPLAY DEVICE

TECHNICAL FIELD

Embodiments of the present disclosure relate to a discharge circuit, an array substrate, a liquid crystal display panel and a display device.

BACKGROUND

A Liquid Crystal Display (LCD) has an important position in the field of panel display because of its advantages of lightness, thinness, low power consumption, high brightness, high picture quality, and the like. The array substrate in a liquid crystal display panel of the LCD includes pixel units and data lines, the data lines are connected to the pixel units, and the pixel units are controlled by the data lines to work. In an outage process of the display device, charge accumulation may appear on the data lines, resulting in situations of work delay of the pixel units, flickering of the LCD, poor crosstalk or electrostatic discharge damage, and therefore, it is required to release the charges on the data lines through a discharge circuit.

An existing discharge circuit includes a discharge thin film transistor and a switch signal line, a gate electrode of the discharge thin film transistor is connected to the switch signal line, one of a source electrode and a drain electrode of the discharge thin film transistor is connected to the data lines and the other is connected to a common electrode on an array substrate, and then the discharge thin film transistor is controlled by the switch signal line to release the charges on the data lines to the common electrode. However, since the common electrode is generally disposed on a frame of the LCD, with the development trend of a thin frame design of the LCD, the width of the common electrode is getting smaller and smaller, a capacity to bear the charges is becoming weaker and weaker, the charges on the data lines cannot be totally and quickly released to the common electrode, which also easily results in the situations of work delay of the pixel units, flickering of the LCD, poor crosstalk or electrostatic discharge damage.

SUMMARY

First aspect, A discharge circuit is provided in the embodiments of this disclosure, the discharge circuit comprises a discharge transistor, a signal control end and a low voltage power source end, wherein, a gate electrode of the discharge transistor is connected to the signal control end, a first electrode of the discharge transistor is electrically connected to a signal line, and a second electrode of the discharge transistor is electrically connected to the low voltage power source end; the discharge transistor is configured to release charges on the signal line to the low voltage power source end under an action of a control signal output by the signal control end.

Second aspect, an array substrate is provided in the embodiments of this disclosure, the array substrate comprises the discharge circuit.

Third aspect, a liquid crystal display panel is provided in the embodiments of this disclosure, the liquid crystal display panel comprises the array substrate.

Forth aspect, a display device is provided in the embodiments of this disclosure, the display device comprises the liquid crystal display panel.

BRIEF DESCRIPTION OF THE DRAWINGS

In order to make the embodiments of the disclosure apparent, the drawings related to the embodiments of the disclosure will be described briefly. Apparently, the described embodiments are just a part of the embodiments of the disclosure. For those skilled in the art, he or she can obtain other figure(s) according to these figures, without any inventive work.

REFERENCE SIGNS

1—Discharge transistor, 11—Gate electrode of the discharge transistor, 12—First electrode of the discharge transistor, 13—Second electrode of the discharge transistor, 2—Signal control end, 3—Low voltage power source end, 4—Signal line, 5—First electrostatic discharge protection transistor, 51—Gate electrode of the first electrostatic discharge protection transistor, 52—First electrode of the first electrostatic discharge protection transistor, 53—Second electrode of the first electrostatic discharge protection transistor, 6—Second electrostatic discharge protection transistor, 61—Gate electrode of the second electrostatic discharge protection transistor, 62—First electrode of the second electrostatic discharge protection transistor, 63—Second electrode of the second electrostatic discharge protection transistor, 7—High voltage power source end, 8—Signal control line, 9—Low voltage power source line, 10—High voltage power source line, A—Electrostatic discharge protection module, B—Signal control module, B1—Charge detection line, B2—Signal output line.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Embodiment 1

Figure 1:
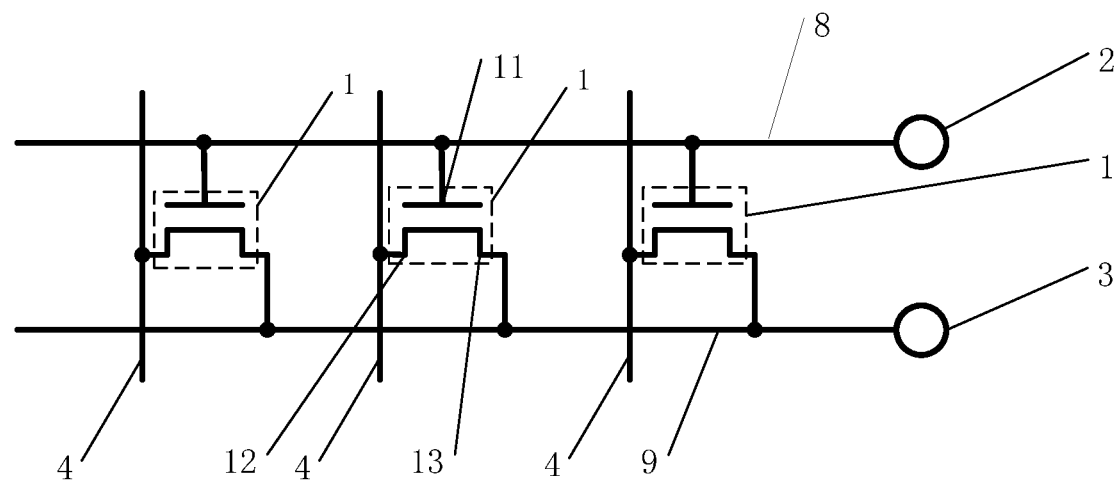
FIG. 1 is a structural schematic diagram of a discharge circuit provided by one embodiment of the present disclosure.

As shown in FIG. 1, an embodiment of the present disclosure provides a discharge circuit. The discharge circuit comprises a discharge transistor 1, a signal control end 2 and a low voltage power source end 3, wherein a gate electrode 11 of the discharge transistor 1 is connected to the signal control end 2, a first electrode 12 of the discharge transistor 1 is electrically connected to a signal line 4, and a second electrode 13 of the discharge transistor 1 is electrically connected to the low voltage power source end 3; and The discharge transistor 1 is configured to release charges on the signal line 4 to the low voltage power source end 3 under an action of a control signal output by the signal control end 2.

An array substrate includes a base substrate, pixel units and data lines and gate lines formed on the base substrate; in the embodiment of the present disclosure, the signal line 4 can be a data line or a gate line, wherein one end of the data line is connected to a source electrode of a pixel thin film transistor controlling the pixel unit to work, the other end of the data line is connected to the pixel unit, the pixel thin film transistor controls the pixel unit to work by the data line; one end of the gate line on the array substrate is connected to a gate signal control end, the other end of the gate line is connected to the gate electrode of the pixel thin film transistor, and the gate signal control end controls the pixel thin film transistor to work through the gate line.

In an outage process of the display device, the gate signal control end controls the pixel thin film transistor to be turned off through the gate line; if charges are accumulated on the data line, then the pixel unit cannot stop working immediately, which results in the situations of flickering of the display device, poor crosstalk or electrostatic discharge damage; if the charges are accumulated on the gate line, a signal sent from the gate signal control end to control the pixel thin film transistor to be turned off cannot be quickly transmitted to the pixel thin film transistor through the gate line; similarly, the situations of work delay of the pixel units, flickering of the display device, poor crosstalk or electrostatic discharge damage are caused.

In the embodiment of the present discourse, the gate electrode 11 of the discharge transistor is connected to the signal control end 2 through a signal control line 8, the second electrode 13 of the discharge transistor is electrically connected to the low voltage power source end 3 through a low voltage power source line 9, and the signal control line 8 and the low voltage power source line 9 are formed on the base substrate of the array substrate. When the discharge circuit provided by the embodiment of the present disclosure is used on the array substrate; if the charges are accumulated on the signal line 4 in an outage process of the display device, then the signal control end 2 outputs a control signal, the discharge transistor 1 is controlled to be turned on, and the charges on the signal line 4 are released to the low voltage power source end 3 through the discharge transistor 1.

The gate electrode 11 of the discharge transistor of the present disclosure is connected to the signal control end 2, the first electrode 12 of the discharge transistor is electrically connected to the signal line 4, the second electrode 13 of the discharge transistor is electrically connected to the low voltage power source end 3, in an outage process of the display device, the signal control end 2 controls the first electrode 12 of the discharge transistor and the second electrode 13 of the discharge transistor to be turned on through the gate electrode 11 of the discharge transistor, and the charges on the signal line 4 are quickly released to the low voltage power source end 3, which avoids situations of work delay of the pixel units, flickering of the display device, poor crosstalk or electrostatic discharge damage because the charges on the signal line 4 cannot be totally and quickly released.

Of course, those skilled in the art know that in a manufacturing process of the array substrate, operators, machines or detection instruments may carry static electricity, as a result, each manufacturing procedure of the array substrate may generate the static electricity, the static electricity generated on the array substrate is accumulated on the signal line 4, and as a result, the display device is subjected to electrostatic discharge damage. In a normal working process of the display device, when the charges on the signal line 4 are accumulated to some extent, a control signal can be output by the signal control end 2, such that the discharge transistor 1 is turned on, and the charges on the signal line 4 are released to the low voltage power source end 3.

Figure 2:
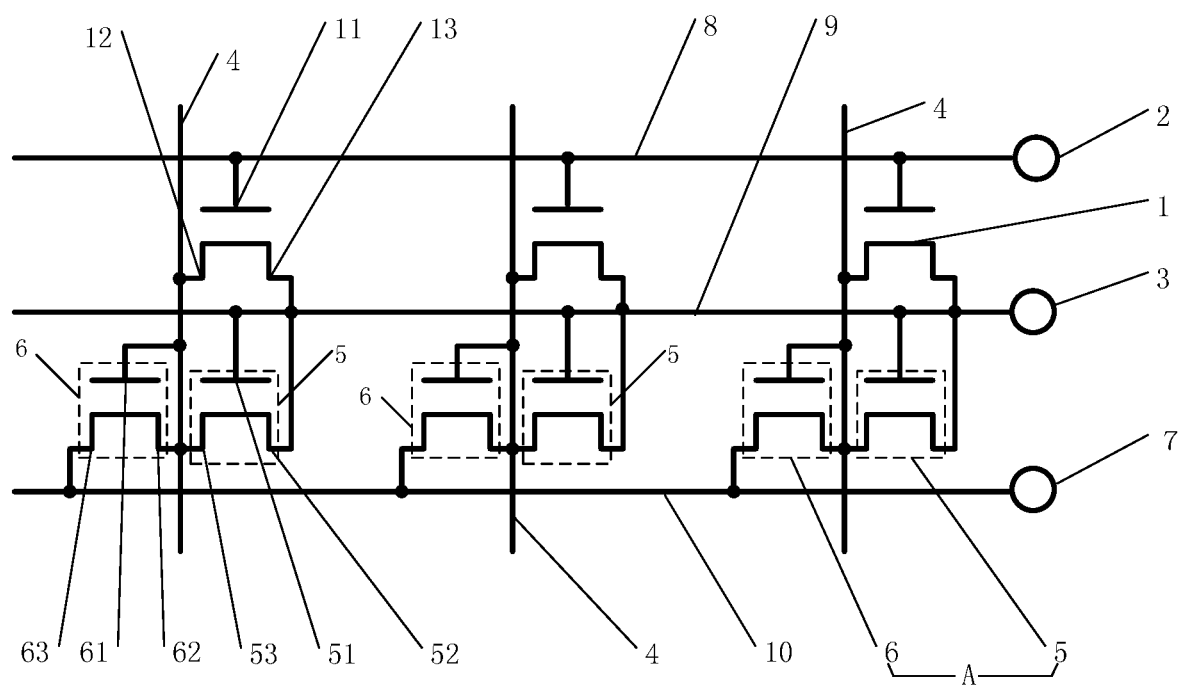
FIG. 2 is a structural schematic diagram of a discharge circuit provided by another embodiment of the present disclosure.

As shown in FIG. 2, the discharge circuit provided by the embodiment of the present disclosure further comprises a high voltage power source end 7 and an electrostatic discharge protection module A, wherein the electrostatic discharge protection module A is electrically connected to the signal line 4, the low voltage power source end 3 and the high voltage power source end 7;

The electrostatic discharge protection module A is configured to release the charges on the signal line 4 to the low voltage power source end 3 when a voltage on the signal line 4 is lower than that of the low voltage power source end 3; and release the charges on the signal line 4 to the high voltage power source end 7 when a voltage on the signal line 4 is higher than that of the high voltage power source end 7.

In the embodiment of the present disclosure, the electrostatic discharge protection module A is electrically connected to the low voltage power source end 3 through the low voltage power source line 9, the electrostatic discharge protection module A is electrically connected to the high voltage power source end 7 through a high voltage power source line 10, and the high voltage power source line 10 is formed on a base substrate of the array substrate.

It can be understood that positive charges or negative charges may be accumulated on the signal line 4 when the charges are accumulated. In the embodiment of the present embodiment, when the display device is not in an outage process, if the amount of the positive charges accumulated on the signal line 4 enables a voltage on the signal line 4 to be higher than that of the high voltage power source end 7, then the positive charges accumulated on the signal line 4 are automatically released to the high voltage power source end 7 through the electrostatic discharge protection module A; and if the amount of the negative charges accumulated on the signal line 4 enables a voltage on the signal line 4 to be lower than that of the low voltage power source end 3, then the negative charges accumulated on the signal line 4 are automatically released to the low voltage power source end 3 through the electrostatic discharge protection module A, and therefore, the display device is prevented from the electrostatic discharge damage.

While the display device is in the outage process, the signal control end 2 sends a control signal to control the discharge transistor 1 to be turned on, the charges on the signal line 4 not only can be released to the low voltage power source end 3 through the discharge transistor 1 but also can be automatically released to the low voltage power source end 3 or the high voltage power source end 7 through the electrostatic discharge protection module A.

By arranging the electrostatic discharge protection module A and the high voltage power source end 7, discharge efficiency of the discharge circuit provided by the embodiment of the present disclosure can be improved, and the electrostatic discharge damage to the display device caused by charge accumulation on the signal line 4 is also prevented.

In the embodiment of the present disclosure, it can be understood that the voltage of the high voltage power source end 7 is a positive value, the voltage of the low voltage power source end 3 is a negative value, and sizes of the voltages of the high voltage power source end 7 and the low voltage power source end 3 take a fact that release of the positive charges and negative charges accumulated on the signal line 4 will not cause the electrostatic discharge damage to the display device as a criterion.

Figure 3:
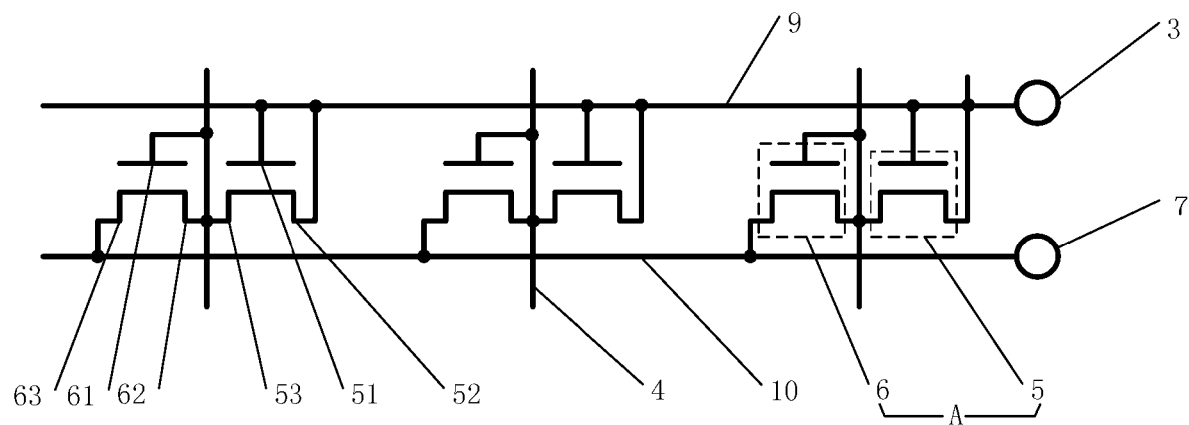
FIG. 3 is a structural schematic diagram of an electrostatic discharge protection module provided by yet another embodiment of the present disclosure.

As shown in FIG. 3 (also referring to FIG. 2), in the embodiment of the present disclosure, the electrostatic discharge protection module A includes a first electrostatic discharge protection transistor 5 and a second electrostatic discharge protection transistor 6;

A gate electrode 51 and a first electrode 52 of the first electrostatic discharge protection transistor 5 are electrically connected to the low voltage power source end 3 respectively, and a second electrode 53 of the first electrostatic discharge protection transistor 5 is electrically connected to the signal line 4; and A gate electrode 61 and a first electrode 62 of the second electrostatic discharge protection transistor 6 are electrically connected to the signal line 4 respectively, and a second electrode 63 of the second electrostatic discharge protection transistor 6 is electrically connected to the high voltage power source end 7.

In the embodiment of the present disclosure, the first electrostatic discharge protection transistor 5 is a P-type thin film transistor, and the second electrostatic discharge protection transistor 6 is an N-type thin film transistor. The gate electrode 51 and the first electrode 52 of the first electrostatic discharge protection transistor are electrically connected to the low voltage power source end 3 through the low voltage power source line 9 respectively, and the second electrode 63 of the second electrostatic discharge protection transistor is electrically connected to the high voltage power source end 7 through the high voltage power source line 10.

In the outage process of the display device, if positive charges are accumulated on the signal line 4, then the signal control end 2 controls the discharge transistor 1 to be turned on, and the positive charges on the signal line 4 are released to the low voltage power source end 3 through the discharge transistor 1; if the voltage on the signal line 4 is higher than that of the high voltage power source end 7, then the second electrostatic discharge protection transistor 6 is turned on, and the charges on the signal line 4 are released to the high voltage power source end 7 through the second electrostatic discharge protection transistor 6; if negative charges are accumulated on the signal line 4, then the signal control end 2 controls the discharge transistor 1 to be turned on, and the charges on the signal line 4 are released to the low voltage power source end 3 through the discharge transistor 1; if the voltage on the signal line 4 is lower than that of the low voltage power source end 3, then the first electrostatic discharge protection transistor 5 is turned on, and the negative charges accumulated on the signal line 4 are released to the low voltage power source end 3 through the first electrostatic discharge protection transistor 5.

Similarly, if the charges are accumulated on the signal line 4 when the display device is in a non-outage process and if positive charges are accumulated on the signal line 4, then when the voltage on the signal line 4 is higher than that of the high voltage power source end 7, the second electrostatic discharge protection transistor 1 is turned on, and the charges on the signal line 4 are released to the high voltage power source end 7 through the second electrostatic discharge protection transistor 1; and if negative charges are accumulated on the signal line 4, then when the voltage on the signal line 4 is lower than that of the low voltage power source end 3, the first electrostatic discharge protection transistor 5 is ON, and the negative charges on the signal line 4 are released to the low voltage power source end 3 through the first electrostatic discharge protection transistor 5.

In the embodiment of the present disclosure, active layers of the discharge transistor 1, the first electrostatic discharge protection transistor 5 and the second electrostatic discharge protection transistor 6 are all made of amorphous silicon or polycrystalline silicon. For example, the polycrystalline silicon is low temperature polycrystalline silicon, such that the discharge transistor 1, the first electrostatic discharge protection transistor 5 and the second electrostatic discharge protection transistor 6 have smaller sizes, and are simple in structure and high in stability. Of course, those skilled in the art know that the active layers of the discharge transistor 1, the first electrostatic discharge protection transistor 5 and the second electrostatic discharge protection transistor 6 can also be made of other semiconductor materials.

Figure 4:
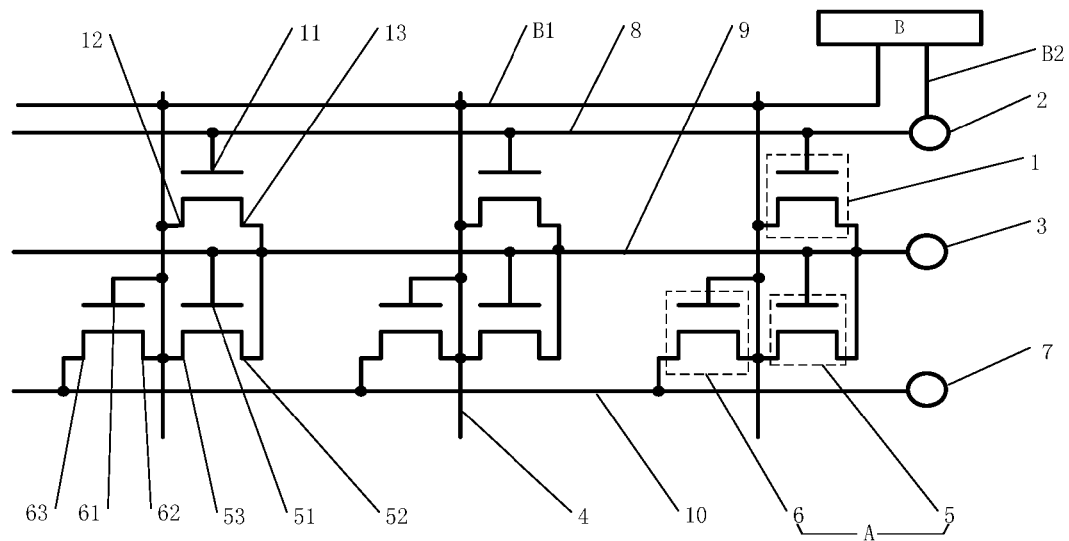
FIG. 4 is a structural schematic diagram of a discharge circuit provided by still a further embodiment of the present disclosure.

As shown in FIG. 4, in the embodiment of the present disclosure, the discharge circuit further comprises a signal control module B, wherein an input end of the signal control module B is electrically connected to the signal line 4, and an output end of the signal control module B is electrically connected to the signal control end 2;

The signal control module B is configured to control the signal control end 2 to emit a control signal when the charges on the signal line 4 reach a preset value.

In the embodiment of the present disclosure, an input end of the signal control module B is electrically connected to the signal line 4 through a charge detection line B1, and an output end of the signal control module B is electrically connected to the signal control end 2 through a signal output line B2. For example, the charge detection line B1 and the signal output line B2 can be formed on the base substrate of the array substrate and can also be disposed in a periphery of the array substrate.

A control signal is sent by the signal control module B when the charges on the signal line 4 reach a preset value, the discharge transistor 1 is turned on, the charges on the signal line 4 are released to the low voltage power source end 3, and when the display device is in the non-outage process, the charges on the signal line 4 are released to the low voltage power source end 3 through the discharge transistor 1, such that electrostatic discharge efficiency is improved and the display device is prevented from the electrostatic discharge damage.

As shown in FIG. 3, in the embodiment of the present disclosure, the signal control module B includes a charge detection module and a pulse signal generator, the charge detection module is electrically connected to the signal line 4, and whether an amount of charges on the signal line 4 reaches a preset value is detected by the charge detection module;

An input end of the pulse signal generator is electrically connected to the charge detection module, and an output end of the pulse signal generator is connected to a gate electrode 11 of the discharge transistor; and The charge detection module is configured to control the first electrode 12 and the second electrode 13 of the discharge transistor to be in breakover by emitting a pulse signal through the pulse signal generator when the charges on the signal line 4 exceed the preset value.

In the embodiment of the present disclosure, the charge detection module is electrically connected to the signal line 4 through the charge detection line B1, and an output end of the pulse signal generator is electrically connected to the signal control end 2 through the signal output line B2. When the charge detection module detects that the charges on the signal line 4 exceed a preset value, the information is transmitted to the pulse signal generator which sends a pulse signal, such that the discharge transistor 1 is turned on, the charges on the signal line 4 are released to the low voltage power source end 3, the structure is simple, electrostatic discharge efficiency is improved and the display device is prevented from the electrostatic discharge damage.

In the embodiment of the present disclosure, the discharge transistor 1 is a thin film transistor, wherein the discharge transistor is an N-type thin film transistor or a P-type thin film transistor. If the discharge transistor 1 is the N-type thin film transistor, then the discharge transistor 1 is turned on when the signal control end 2 sends a high level signal; and if the discharge transistor 1 is the P-type thin film transistor, then the discharge transistor 1 is turned on when the signal control end 2 sends a low level signal. For example, the discharge transistor 1 is the N-type thin film transistor.

Embodiment 2

An embodiment of the present disclosure provides an array substrate, the array substrate comprises the discharge circuit as mentioned in Embodiment 1, and a structural diagram of the discharge circuit is as shown in FIG. 1, and can also refer to FIGS. 2-4, in the embodiment of the present disclosure, the discharge circuit is formed on a base substrate of the array substrate and is connected to the signal line 4 on the arrant substrate, wherein the signal line 4 on the array substrate includes a data line and a gate line.

According to the present disclosure, the gate electrode 11 of the discharge transistor is connected to the signal control end 2, the first electrode 12 of the discharge transistor is electrically connected to the signal line 4, the second electrode 13 of the discharge transistor is electrically connected to the low voltage power source end 3, in the outage process of the display device, the signal control end 2 controls the first electrode 12 of the discharge transistor and the second electrode 13 of the discharge transistor to be turned on by the gate electrode 11 of the discharge transistor, the charges on the signal line 4 are quickly released to the low voltage power source end 3, and the situations of work delay of the pixel units, flickering of the display device, poor crosstalk or electrostatic discharge damage since the charges on the signal line 4 cannot be totally quickly released are avoided.

In the embodiment of the present disclosure, the electrostatic discharge protection module A of the discharge circuit is arranged in the periphery of the array substrate, such that a thickness of the array substrate is reduced, and a current trend of lightness and thinness production of the liquid crystal display is followed.

Embodiment 3

An embodiment of the present disclosure provides a liquid crystal display panel, comprising the array substrate as mentioned in Embodiment 2.

By disposing the discharge circuit as shown in FIG. 1, 2, 3 or 4 on the base substrate of the array substrate, the gate electrode 11 of the discharge transistor of the discharge circuit is connected to the signal control end 2, the first electrode 12 of the discharge transistor is electrically connected to the signal line 4, and the second electrode 13 of the discharge transistor is electrically connected to the low voltage power source end 3; according to a display device using the liquid crystal display panel provided by the present disclosure, in the outage process, the signal control end 2 controls the first electrode 12 of the discharge transistor and the second electrode 13 of the discharge transistor to be turned on by the gate electrode 11 of the discharge transistor, and the charges on the signal line 4 are quickly released to the low voltage power source end 3, which avoids situations of work delay of the pixel units, flickering of the display device, poor crosstalk or electrostatic discharge damage because the charges on the signal line 4 cannot be totally quickly released.

Embodiment 4

An embodiment of the present disclosure provides a display device, comprising the liquid crystal display panel as mentioned in Embodiment 3.

According to the embodiment of the present disclosure, a discharge circuit is disposed on the array substrate in the liquid crystal display panel, a structure of the discharge circuit is as shown in FIGS. 1-4, the gate electrode 11 of the discharge transistor of the discharge circuit is connected to the signal control end 2, the first electrode of the discharge transistor 1 is electrically connected to the signal line 4, the second electrode is electrically connected to the low voltage power source end 3; in the outage process of the display device, the signal control end 2 controls the first electrode and the second electrode of the discharge transistor 1 to be turned on by the gate electrode 11 of the discharge transistor, the charges on the signal line 4 are quickly released to the low voltage power source end 3, which voids situations of work delay of the pixel units, flickering of the display device, poor crosstalk or electrostatic discharge damage because the charges on the signal line 4 cannot be totally quickly released.

In this disclosure, the relationship terms such as "first" and "second" are only used to depart an object or an operation from another object or an operation, but not always intended to require or imply that any actual relationship or sequence exist in these objects or operation. Furthermore, the terms "include", "including" etc. are intended to cover non-exclusive including, therefore the process, method, article or device including a series of elements not only includes those elements, but also includes other elements which are not listed out, or also includes inherent elements of this process, method, article or device. Without other limitation, the elements limited with "includes one", does not exclude the condition that other same elements exist in the process, method, article or device including said elements.

Obviously, those skilled in the art may make any changes and modification to this disclosure not separated from the scope of this disclosure. In this way, if these change and modification are attached to the scope of the claims in this disclosure or equal techniques thereof, then this disclosure intends to include these changes and modification.

What are described above is related to the illustrative embodiments of the disclosure only and not limitative to the scope of the disclosure. Obvious variations and replacement by any one of the skilled person in the art in the technical scope of the disclosure should be all covered in the scope of this disclosure. The scopes of the disclosure are defined by the accompanying claims.

The present application claims the priority of the Chinese Patent Application No. 201610065459.9 filed on Jan. 29, 2016, which is incorporated herein in its entirety by reference as part of the disclosure of the present application.

The invention claimed is:

1. A discharge circuit, comprising a discharge transistor, a signal control end and a low voltage power source end, wherein, a gate electrode of the discharge transistor is connected to the signal control end, a first electrode of the discharge transistor is electrically connected to a signal line, and a second electrode of the discharge transistor is electrically connected to the low voltage power source end;

the discharge transistor is configured to release charges on the signal line to the low voltage power source end under an action of a control signal output by the signal control end, wherein the discharge circuit further comprises a signal control module, an input end of the signal control module is electrically connected to the signal line, and an output end of the signal control module is electrically connected to the signal control end; and the signal control module is configured to input through the output end the control signal to the gate electrode of the discharge transistor connected to the signal control end to release through the discharge transistor charges on the signal line to the low voltage power source end, in a case where the charges on the signal line connected to the input end reach a selected value.

2. The discharge circuit according to claim 1, further comprising a high voltage power source end and an electrostatic discharge protection module, wherein, the electrostatic discharge protection module is electrically connected to the signal line, the low voltage power source end and the high voltage power source end;

the electrostatic discharge protection module is configured to:

release the charges on the signal line to the low voltage power source end under a condition that a voltage on the signal line is lower than that of the low voltage power source end; and release the charges on the signal line to the high voltage power source end under a condition that a voltage on the signal line is higher than that of the high voltage power source end.

3. The discharge circuit according to claim 2, wherein the electrostatic discharge protection module comprises a first electrostatic discharge protection transistor and a second electrostatic discharge protection transistor;

a gate electrode and a first electrode of the first electrostatic discharge protection transistor are electrically connected to the low voltage power source end respectively, and a second electrode of the first electrostatic discharge protection transistor is electrically connected to the signal line; and a gate electrode and a first electrode of the second electrostatic discharge protection transistor are electrically connected to the signal line respectively, and a second electrode of the second electrostatic discharge protection transistor is electrically connected to the high voltage power source end.

4. An array substrate, comprising the discharge circuit according to claim 2.

5. The discharge circuit according to claim 3, wherein active layers of the discharge transistor, the first electrostatic discharge protection transistor and the second electrostatic discharge protection transistor are all made of amorphous silicon or polycrystalline silicon.

6. An array substrate, comprising the discharge circuit according to claim 3.

7. The discharge circuit according to claim 5, wherein the polycrystalline silicon is low temperature polycrystalline silicon.

8. An array substrate, comprising the discharge circuit according to claim 5.

9. An array substrate, comprising the discharge circuit according to claim 7.

10. The discharge circuit according to claim 1, wherein the signal control module comprises a charge detection module and a pulse signal generator, the charge detection module is electrically connected to the signal line, and the charge detection module detects whether an amount of charges on the signal line reaches a selected value;

an input end of the pulse signal generator is electrically connected to the charge detection module, and an output end of the pulse signal generator is connected to a gate electrode of the discharge transistor; and the charge detection module is configured to control the first electrode and the second electrode of the discharge transistor to be turned on by emitting a pulse signal through the pulse signal generator when the charges on the signal line exceed the selected value.

11. The discharge circuit according to claim 1, wherein the signal line is a gate line or a data line.

12. The discharge circuit according to claim 1, wherein the discharge transistor is a thin film transistor.

13. The discharge circuit according to claim 12, wherein the discharge transistor is an N-type thin film transistor or a P-type thin film transistor.

14. An array substrate, comprising the discharge circuit according to claim 1.

15. The array substrate according to claim 14, wherein the electrostatic discharge protection module of the discharge circuit is disposed around the array substrate.

16. A liquid crystal display panel, comprising the array substrate according to claim 15.

17. A liquid crystal display panel, comprising the array substrate according to claim 14.

18. A display device, comprising the liquid crystal display panel according to claim 17.

* * * * *